US009472602B2

(12) United States Patent
Xu et al.

(10) Patent No.: US 9,472,602 B2
(45) Date of Patent: Oct. 18, 2016

(54) DISPLAY SYSTEMS AND DEVICES HAVING ARRAY OF PHOTOVOLTAIC MATERIAL CONFIGURED TO ABSORB AND CONVERT LIGHT INTO ELECTRONIC CURRENT

(71) Applicant: Xiaomi Inc., Beijing (CN)

(72) Inventors: Duo Xu, Beijing (CN); Bin Lin, Beijing (CN); Jun Lei, Beijing (CN)

(73) Assignee: Xiaomi Inc., Beijing (CN)

( * ) Notice: Subject to any disclaimer, the term of this patent is extended or adjusted under 35 U.S.C. 154(b) by 0 days.

(21) Appl. No.: 14/835,276

(22) Filed: Aug. 25, 2015

(65) Prior Publication Data

US 2015/0364528 A1 Dec. 17, 2015

Related U.S. Application Data

(63) Continuation-in-part of application No. PCT/CN2013/091018, filed on Dec. 31, 2013.

(30) Foreign Application Priority Data

Feb. 4, 2013 (CN) .......................... 2013 1 0044954

(51) Int. Cl.
*H01L 27/32* (2006.01)
*H01L 31/054* (2014.01)
(Continued)

(52) U.S. Cl.
CPC ............ *H01L 27/3227* (2013.01); *G09F 9/30* (2013.01); *G09F 27/007* (2013.01); *H01L 27/322* (2013.01); *H01L 27/323* (2013.01); *H01L 31/0384* (2013.01); *H01L 31/03762* (2013.01); *H01L 31/03925* (2013.01); *H01L 31/046* (2014.12); *H01L 31/0547* (2014.12); *H01L 51/5275* (2013.01); *H01L 51/5293* (2013.01);
(Continued)

(58) Field of Classification Search
CPC ..................................................... H01L 31/143
See application file for complete search history.

(56) References Cited

U.S. PATENT DOCUMENTS 6,046,401 A * 4/2000 McCabe ................... G09F 9/33
136/244
6,356,031 B1 * 3/2002 Thagard .............. H01L 27/3227
257/21
(Continued)

FOREIGN PATENT DOCUMENTS

CN 1342963 A 4/2002
CN 1875313 A 12/2006
(Continued)

OTHER PUBLICATIONS

International Search Report and Written Opinion dated Apr. 3, 2014 for International Application No. PCT/CN2013/091018, 21 pages.
(Continued)

*Primary Examiner* — Stephen W Smoot
(74) *Attorney, Agent, or Firm* — Brinks, Gilson & Lione

(57) ABSTRACT

A display device is provided. A photovoltaic material (61) is evenly disposed in a display layer (6), so that an array formed by the photovoltaic material (61) forms light transmitting units (62) and the photovoltaic material (61) forms a path. Light emitted by a backlight layer (5) and ambient light are absorbed without affecting the light emission of the display layer (6), and are converted into current. When the current converted from light energy is used for a mobile terminal, the stand by time of the mobile terminal may be increased.

20 Claims, 14 Drawing Sheets

(51) Int. Cl.
*G09F 27/00* (2006.01)
*G09F 9/30* (2006.01)
*H01L 31/046* (2014.01)
*H01L 31/0376* (2006.01)
*H01L 31/0384* (2006.01)
*H01L 31/0392* (2006.01)
*H01L 51/52* (2006.01)
*G02F 1/133* (2006.01)

(52) U.S. Cl.
CPC ...... *G02F 2001/13324* (2013.01); *Y02E 10/52* (2013.01)

(56) References Cited

U.S. PATENT DOCUMENTS

| | | | |
|---|---|---|---|
| 6,452,088 | B1 | 9/2002 | Schmidt |
| 2010/0065121 | A1* | 3/2010 | Sheu .................. B82Y 20/00 136/261 |
| 2010/0201926 | A1 | 8/2010 | Lee |
| 2010/0245741 | A1 | 9/2010 | Chung et al. |
| 2010/0284055 | A1 | 11/2010 | Kothari et al. |
| 2011/0163661 | A1* | 7/2011 | Lee .................... H01L 27/3227 313/504 |
| 2011/0284053 | A1* | 11/2011 | Brewer ................ H01L 25/167 136/246 |
| 2012/0105780 | A1* | 5/2012 | Jhan .................... G02F 1/13718 349/116 |
| 2012/0236540 | A1 | 9/2012 | Gilbert et al. |
| 2014/0024151 | A1* | 1/2014 | Zhang ................ H01L 31/046 438/24 |

FOREIGN PATENT DOCUMENTS

| | | |
|---|---|---|
| CN | 1979291 A | 6/2007 |
| CN | 101340471 A | 1/2009 |
| CN | 101387790 A | 3/2009 |
| CN | 101685218 A | 3/2010 |
| CN | 101852947 A | 10/2010 |
| CN | 101900898 A | 12/2010 |
| CN | 102006093 A | 4/2011 |
| CN | 102759816 A | 10/2012 |
| CN | 103137024 A | 6/2013 |
| CN | 203351134 U | 12/2013 |
| EP | 2 051 124 A2 | 4/2009 |
| JP | H-0367382 U | 7/1991 |
| JP | 11-295725 A | 10/1999 |
| JP | 2000-268891 A | 9/2000 |
| JP | 2005-044732 A | 2/2005 |
| JP | 2008-145835 A | 6/2008 |
| JP | 2008-164851 A | 7/2008 |
| JP | 2012-134476 A | 7/2012 |
| JP | 2013-020176 A | 1/2013 |
| KR | 2012-0055086 A | 5/2012 |
| KR | 10-2012-0072472 A | 7/2012 |
| WO | WO 2007/024898 A2 | 3/2007 |
| WO | WO 2011/156344 A2 | 12/2011 |
| WO | WO 2012/104503 A1 | 8/2012 |

OTHER PUBLICATIONS

Notice of Request for Invalidation dated Jan. 26, 2015 for Chinese Application No. 201310044954.8, 142 pages.
Office Action dated Jun. 11, 2014 for Chinese Application No. 201310044954.8, 6 pages.
Office Action dated Mar. 8, 2016 for Japanese Application No. 2015-543289, 5 pages.
Office Action dated Jul. 13, 2016 for Russian Application No. 2015122133/28, 14 pages.

* cited by examiner

DISPLAY SYSTEMS AND DEVICES HAVING ARRAY OF PHOTOVOLTAIC MATERIAL CONFIGURED TO ABSORB AND CONVERT LIGHT INTO ELECTRONIC CURRENT

PRIORITY STATEMENT

The present application is a continuation-in-part of International Application No. PCT/CN2013/091018, filed Dec. 31, 2013, which is based on and claims the priority of Chinese Patent Application No. 201310044954.8, filed Feb. 4, 2013, the entirety of which are incorporated herein by reference.

TECHNICAL FIELD

The present disclosure generally relates to the field of display and, more particularly, to a display device.

BACKGROUND

With the development of mobile terminals, display systems for the mobile terminals have become particularly important. The display systems used in the conventional mobile terminal such as a mobile phone or a tablet computer are usually a display screen based on the RGB (Red, Green, Blue) color mode.

Generally, in a display system, the light emitting and display layer of the display screen takes a pixel as a display unit, and a control circuit is provided to circle around each display unit. In the RGB color mode, one intensity value with a range of 0-255 is distributed to RGB components of each pixel in an image by using the RGB model, and each RGB color is controlled by the circuit provided around each pixel, so as to display color images.

Currently, most of the mainstream display screens include TFT (Thin Film Transistor) screens, OLED (Organic Light-Emitting Diode) screen, a STN (Super Twisted Nematic) screens, PDP (Plasma Display Panel) screens, etc. As the light transmittance and color rendition of these screens improve, users of these screens are generally satisfied with their display effect.

SUMMARY

As the mobile terminals become bigger and thinner, screens of the mobile terminals that has traditional design has become one of the main power consuming unit in the mobile terminal. As a result, standby time of the mobile terminal becomes shorter, and user experience is reduced. The exemplary embodiments of the present disclosure provide display systems and devices, which absorb light energy and convert it to electrical energy for a mobile terminal without affecting a display effect. The invention introduced in the present disclosure improves display screen technologies and functions of a mobile terminal that includes such a display screen by increasing standby time of the mobile terminal improving user experiences on the mobile terminal.

According to an aspect of the present disclosure, a display device may comprise a light emitting and display layer and a supporting layer under the light emitting and display layer. The light emitting and display layer may be configured to display an image by emitting light, including a first array of pixels and pixel driving circuits; and the supporting layer may include a second array of photovoltaic material under the array of pixel driving circuits to absorb light emitted from the light emitting and display layer and convert the light into an electronic current.

According to another aspect of the present disclosure, a display device may comprise a display layer, a backlight layer, and a supporting layer. The display layer may be configured to display an image and may include a first array of photovoltaic material configured to absorb and convert light into an electronic current and a plurality of light transmitting units; the backlight layer may be under the display layer and configured to provide light source for the display layer; and the supporting layer may be under the backlight layer to support the display layer and backlight layer.

It is to be understood that the foregoing general description and the following detailed description are exemplary and explanatory only and are not restrictive of the invention.

Specific exemplary embodiments in this disclosure have been shown by way of example in the foregoing drawings and are hereinafter described in detail. The figures and written description are not intended to limit the scope of the inventive concepts in any manner. Rather, they are provided to illustrate the inventive concepts to a person skilled in the art by reference to particular exemplary embodiments.

DETAILED DESCRIPTION

Hereinafter, implementations of a display device and a device according to the exemplary embodiments of the present disclosure will be described in detail in conjunction with the drawings.

First Embodiment

Figure 1:
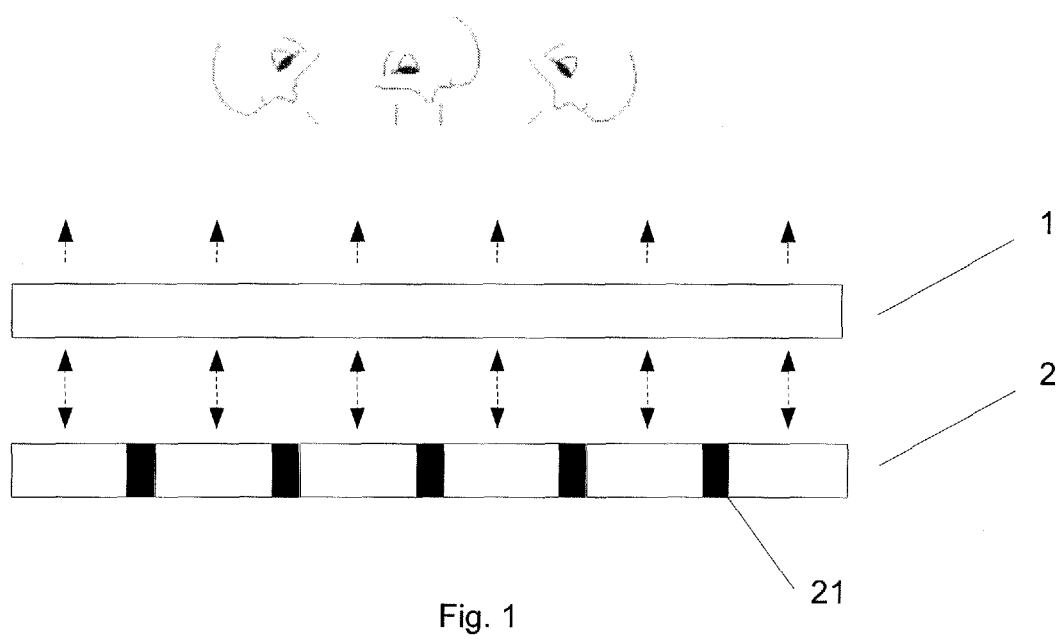
FIG. 1 is a cross-section diagram of a structure of a display device according to a first exemplary embodiment of the present disclosure.

FIG. 1 is a cross-section diagram of a structure of a display device according to a first exemplary embodiment of the present disclosure. For example, the display device may be a display screen in an electronic device. The electronic device may be a terminal device such as a mobile device. The mobile device may be a smart phone, a cell phone, a tablet computer, a laptop computer, and a PDA, etc. electronic device may also be other types of terminal device, such as a TV, a computer monitor etc. The display may include:

A light emitting and display layer 1 and a supporting layer 2. Wherein the light emitting and display layer 1 is located above the supporting layer 2 and is configured to display images by emitting light therefrom. The supporting layer 2 includes a photovoltaic array formed by a photovoltaic material 21, the array is positioned horizontally (e.g., parallel to) and directly (or indirectly) under driving circuits in the light emitting and display layer 1, and parts of the photovoltaic material 21 in the array are connected and form a path (or the array formed by the photovoltaic material forms a path) to absorb the light emitted from the light emitting and display layer 1 and convert the light into current.

In order to display different colors, the display screen may use a RGB model, i.e., the light emitting and display layer may include an array of pixels, and the display screen may take individual pixel as a display unit. To achieve different color scheme, the light emitting and display layer 1 may also include a driving circuit disposed around each pixel, for example, a TFT array may be disposed in a display layer of a TFT screen.

In the display screen provided by the exemplary embodiments of the present disclosure, the photovoltaic material may be provided in the supporting layer 2 of the screen. To avoid affecting the light emitting of the screen, the photovoltaic array may be formed by embedding the photovoltaic material 21 in a reflector according to an exemplary embodiment.

According to an exemplary embodiment, the photovoltaic material may be embedded in the reflector as follows: a groove is formed at a preset position of the reflector by photolithography, and then the photovoltaic material 21 is provided and/deposited in the groove. The photovoltaic material may be deposited in the groove via chemical deposition, sputtering, or any applicable method technically doable at the time of the filing of the present disclosure. Further, a depth of the groove may be predetermined. For example, the depth of the groove may be determined based on a photon-to-electron conversion efficiency of the photovoltaic material 21.

Figure 2:
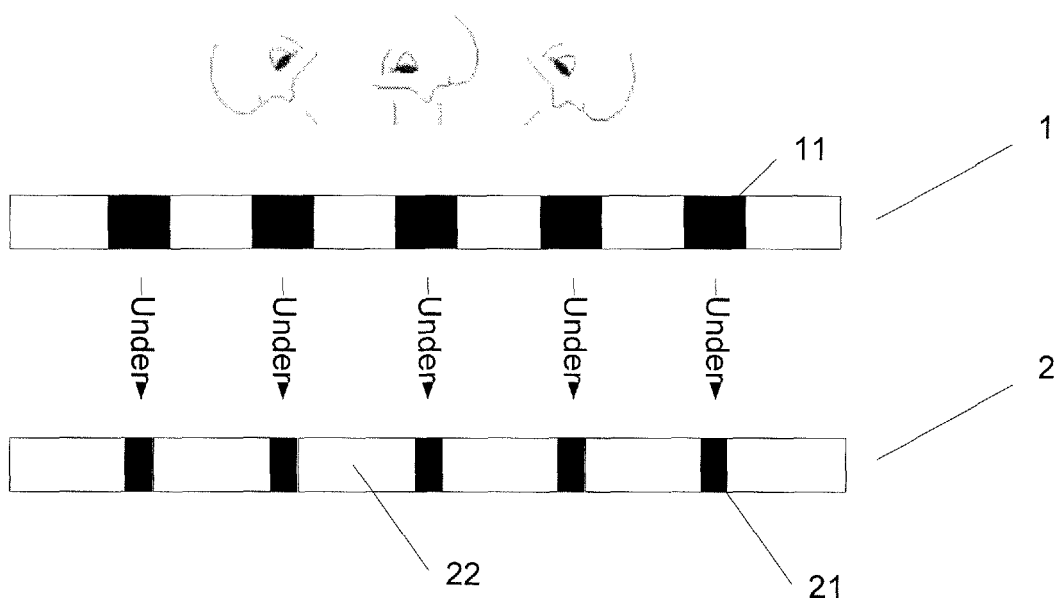
FIG. 2 is a schematic diagram of position where a photovoltaic material is embedded in a reflector of the display device according to the first exemplary embodiment of the present disclosure.

Moreover, as illustrated in FIG. 2, the embedding position of the photovoltaic material 21 in the reflector should be a preset position, assuring that after the light emitting and display layer 1 of the display screen is installed above the supporting layer 2, the embedding position is under a part or all of a driving circuit region 11. A region in the supporting layer 2 except the photovoltaic material 21 is occupied by a reflective material 22. The reflective material 22 is configured to replace the original reflector and reflecting back the light emitted from the light emitting and display layer 1 so as to increase a brightness of the display screen.

The array of the photovoltaic material 21 may be located horizontally (e.g., parallel to the light emitting and display layer 1), and viewing from a cross section of the display device, the array of the photovoltaic material 21 is directly under the array of the driving circuits. The photovoltaic material 21 in the photovoltaic array may be no wider than a width of an individual driving circuit to avoid that the reflected light is too little and the brightness of the screen is reduced. For example, when the photovoltaic material 21 is narrower than the width of the corresponding driving circuit, the photovoltaic material 21 is directly beneath a preset part of a corresponding driving circuit. Alternatively, if the photovoltaic material 21 is equally wide to the individual driving circuit, the photovoltaic material may be directly under the entire area of the corresponding individual driving circuit in the light emitting and display layer 1.

FIG. 2 is a schematic diagram of position where the photovoltaic material 21 is embedded in a reflector 22 of the display device. In FIG. 2 a horizontal area of the photovoltaic material 21 is less than that of the driving circuits 11.

In order to fully explain this scheme, the following two layout diagrams of the photovoltaic material are provided by the present exemplary embodiment.

Figures 3, 4:
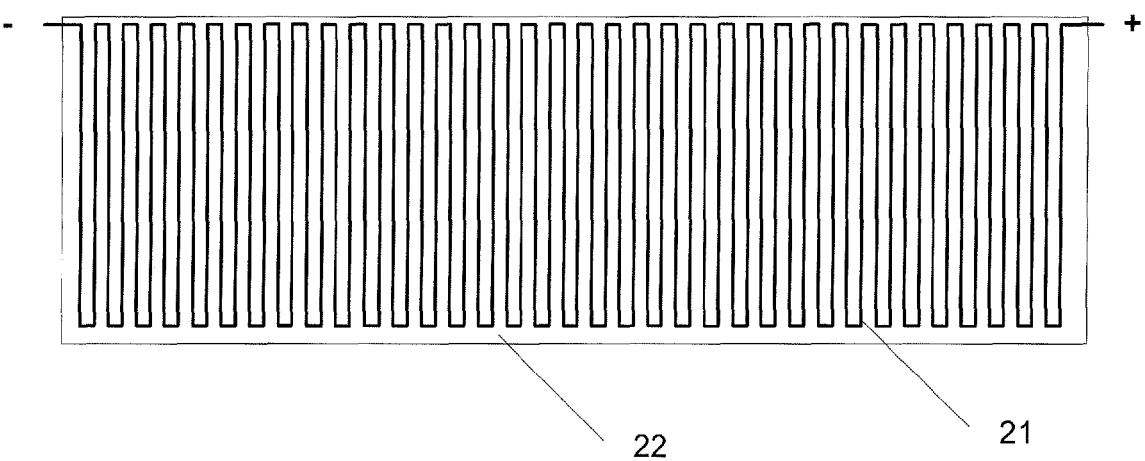
FIG. 3 is a first plan view of a layout diagram of a photovoltaic material in a supporting layer of the display device according to the first exemplary embodiment of the present disclosure.
FIG. 4 is a plan view of a second layout diagram of the photovoltaic material in the supporting layer of the display device according to the first exemplary embodiment of the present disclosure.

FIG. 3 shows a plan view of a first layout diagram of the photovoltaic material in the supporting layer 2.

The array formed by the photovoltaic material 21 includes multiple parallel photovoltaic material lines of a same length. The multiple photovoltaic material lines are connected in series for formed a comb-like shape and arranged in a horizontal direction of the display device (horizontal direction of the display device, such as a face direction of the display device), and gaps in the array of the photovoltaic material are occupied by the reflective material 22 which functions as the reflector. The reflector may have a perfect reflection to the light emitted from the light emitting and display layer 1. Alternatively, the reflector may have a perfect reflection to a predetermined spectrum of light emitted from the light emitting and display layer 1. As a result, gaps in the photovoltaic array are configured to conduct a perfect reflection to at least a predetermined spectrum of the light (e.g., visible light) emitted from the light emitting and display layer. The array of the photovoltaic material forms a circuit which includes two poles of "+" and "−", so that when the photovoltaic material converts light to a current, the current obtained by the conversion may be transmitted to an electric energy storage device or an electric energy consumption device.

FIG. 4 shows a plan view of the supporting layer 2, which is the second layout diagram of the photovoltaic material provided by the present exemplary embodiment.

The display takes a pixel as a display unit, and each display unit includes three colors, i.e., red, green, and blue (i.e., RGB). In FIG. 4, each RGB indicates a region in the supporting layer corresponding to a region directly under each pixel in the display layer. The photovoltaic material 21 is provided around each of the corresponding pixel regions to form an array, and each of the corresponding pixel regions is provided with the reflective material 22 which functions as the reflector. The array of the photovoltaic material forms a circuit which includes two poles of "+" and "−", so that the current obtained by the conversion may be transmitted to an electric energy storage device or an electric energy consumption device, such as the display device itself or a processor of the electronic device that the display device is in.

Figures 5, 6:
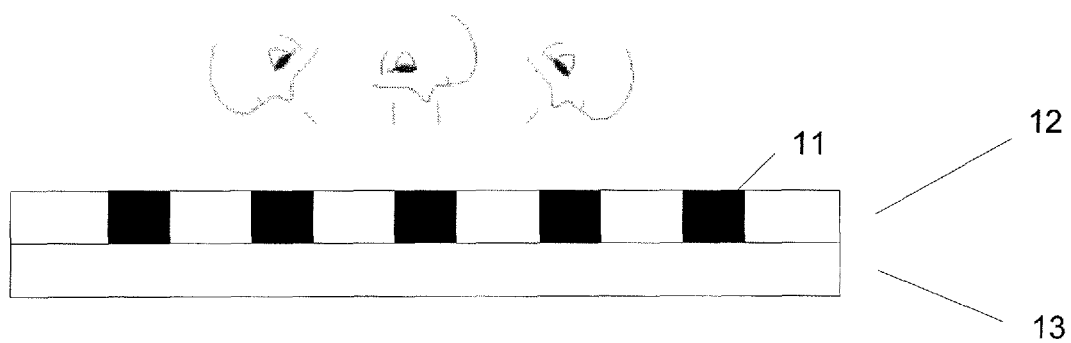
FIG. 5 is a schematic diagram of a pixel configuration of each display layer of the display device according to the first exemplary embodiment of the present disclosure.
FIG. 6 is a cross-section diagram of a first light emitting and display layer of the display device according to the first exemplary embodiment of the present disclosure.

The photovoltaic material may also be provided in gap regions between pixels. FIG. 5 illustrates the composition of each pixel in the display layer, wherein each of R, G, B indicates one color of each pixel. The driving circuits such as a TFT array are also positioned in a connecting part (i.e., black line part) of each color to control light intensity of each color emitted from the display layer, and the photovoltaic material may also be provided in a region of the supporting layer corresponding to the connecting part of each color.

It should be noted that, the arrangement form of the photovoltaic material in the supporting layer is not limited by the exemplary embodiments of the present disclosure. The pattern of the layout of the photovoltaic material distributes uniformly on the supporting layer without affecting the reflective effect of the supporting layer.

In an exemplary embodiment, the photovoltaic material used in the first exemplary embodiment may be, but is not limited to, any one or a combination of the following materials with photon-to-electron conversion function: amorphous silicon, microcrystalline silicon, cadmium telluride thin film solar cell, and thin film solar cell.

It should be noted that, the display device provided by the present disclosure is applicable for any display screen. To testify the implementations, the exemplary embodiments of the present disclosure provide the following explanations.

FIG. 6 is a cross-section diagram of a first light emitting and display layer of the display device. Taking the implementation on the non-self-luminous screen (for example, a TFT screen) as an example, as illustrated in FIG. 6, the light emitting and display layer 1 includes a display layer 12 and a backlight layer 13.

The backlight layer 13 is located under the display layer 12 and is configured to provide backlight for the display layer 12.

The display layer 12 is configured to control a display color of each pixel according to the driving circuit 11 and displaying an image under the backlight provided by the backlight layer 13.

In the display screen shown in FIG. 6, since the screen cannot illuminate itself and needs a backlight layer to provide a light source, such that an image could be displayed after the light source illuminates on the display layer, the driving circuits 11 are provided in the display layer 12 to control the color of the image.

Figure 7:
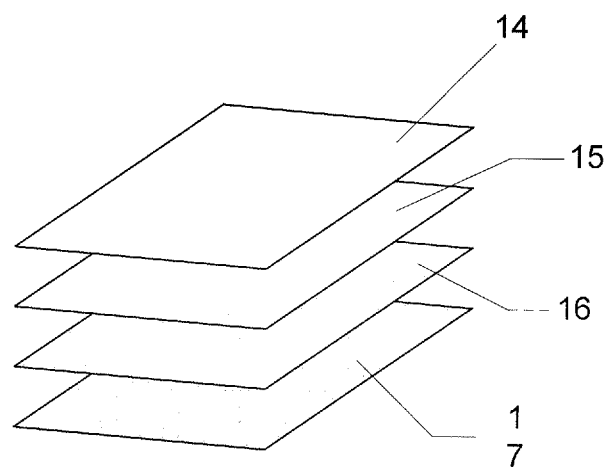
FIG. 7 is a schematic diagram of a second light emitting and display layer of the display device according to the first exemplary embodiment of the present disclosure.

FIG. 7 is a schematic diagram of a second light emitting and display layer of the display device. Taking the implementation on the self-luminous screen (for example, an OLED screen) as an example, as illustrated in FIG. 7, the light emitting and display layer 1 includes a cathode 14, a reflector 15, a conductive layer 16 and an anode 17 arranged in an order from top to bottom.

When the cathode 14 and the anode 17 are applied with a voltage, electrons in the conductive layer 16 move and/or are transmitted to the reflector 15, and holes are formed in the conductive layer 16. Then the holes move and/or transit to the reflector 15, recombine with the electrons, and release energy to emit light.

A thin film transistor (TFT) array may cover the anode 17, and the luminescence of the pixel is determined by the TFT array (i.e., driving circuit) to display the color image.

Figure 8:
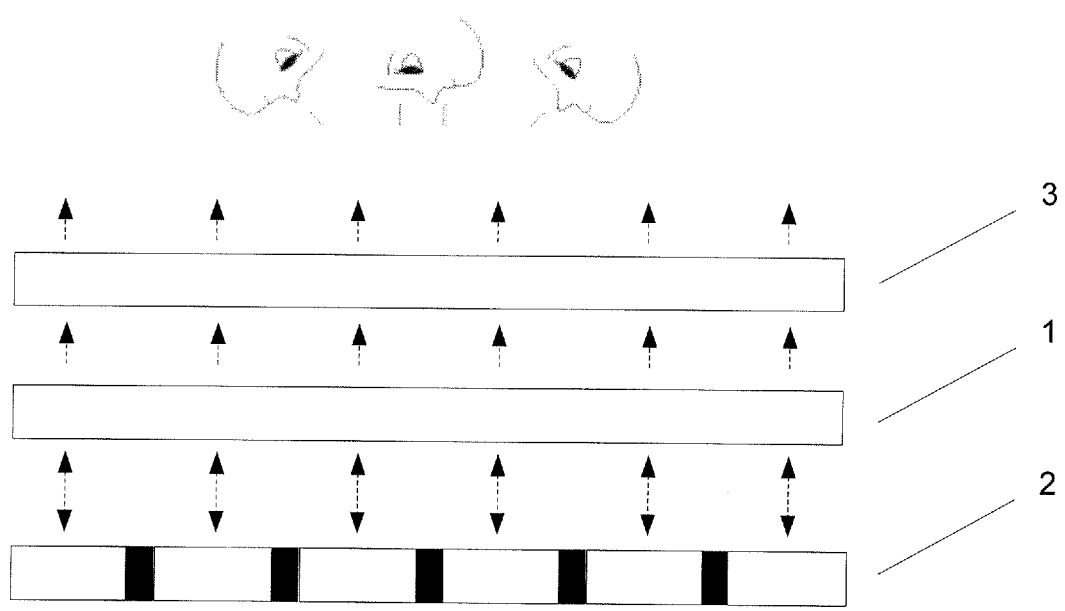
FIG. 8 is a cross-section diagram of another display device according to the first exemplary embodiment of the present disclosure.

In an exemplary embodiment, as illustrated in FIG. 8, the display device provided by the present exemplary embodiment also includes a touching layer 3.

The touching layer is located above the light emitting and display layer 1 and is configured to detect and respond to a tap signal exerted thereon. For example, the touching layer is configured to detect a touch from user and respond to the touch.

After additionally installing the touching layer 3 above the light emitting and display layer 1, the display device may achieve the function of touching screen. The touching layer 3 responds to the tap signal from the user and transmits the signal to the processor for processing. The touching layer 3 includes, but is not limited to, a resistive touch screen, a capacitive touch screen, etc.

The exemplary embodiments of the present disclosure provide a display device, which includes a light emitting and display layer, and a supporting layer; wherein the light emitting and display layer is located above the supporting layer and is configured to display an image by emitting light; the supporting layer includes an array formed by a photovoltaic material, the array is positioned horizontally (e.g., parallel to) and directly under a driving circuit in the light emitting and display layer, and the array formed by the photovoltaic material forms a circuit path for absorbing light emitted from the light emitting and display layer and converting the light into current. In the display device provided by the exemplary embodiments of the present disclosure, the photovoltaic material is embedded in the corresponding position in the supporting layer under the driving circuits of the display layer, and the photovoltaic material forms a circuit path, thus the light emitted from the display layer may be absorbed and converted into current without affecting the light emitting of the display layer, and through applying the current converted from the light energy to a mobile terminal, a standby time of the mobile terminal may be increased and the user experience is improved.

Second Exemplary Embodiment

The present exemplary embodiment provides an electronic device, which includes the display device according to the first exemplary embodiment, and the electronic device receives and uses the electrical current provided and/or produced from the display device.

In the present exemplary embodiment, the electronic device may be a mobile terminal. After the display device in the first exemplary embodiment is installed as a display screen in the mobile terminal, while using a portable power source, the mobile terminal also may receive the current obtained by the photoelectric conversion in the display device for its operation or receive the current and store it in the portable power source for standby application. Thus, the light source emitted from the display screen itself may be reused and recycled, the maximum efficiency of electrical energy may be achieved, the standby time of the mobile terminal may be increased, and the user experience may be improved.

In the present exemplary embodiment, the device is not limited to the mobile terminal such as a mobile phone, a tablet, and a laptop, and it is applicable for any device with a display screen, such as a TV, a desktop computer.

Figure 9:
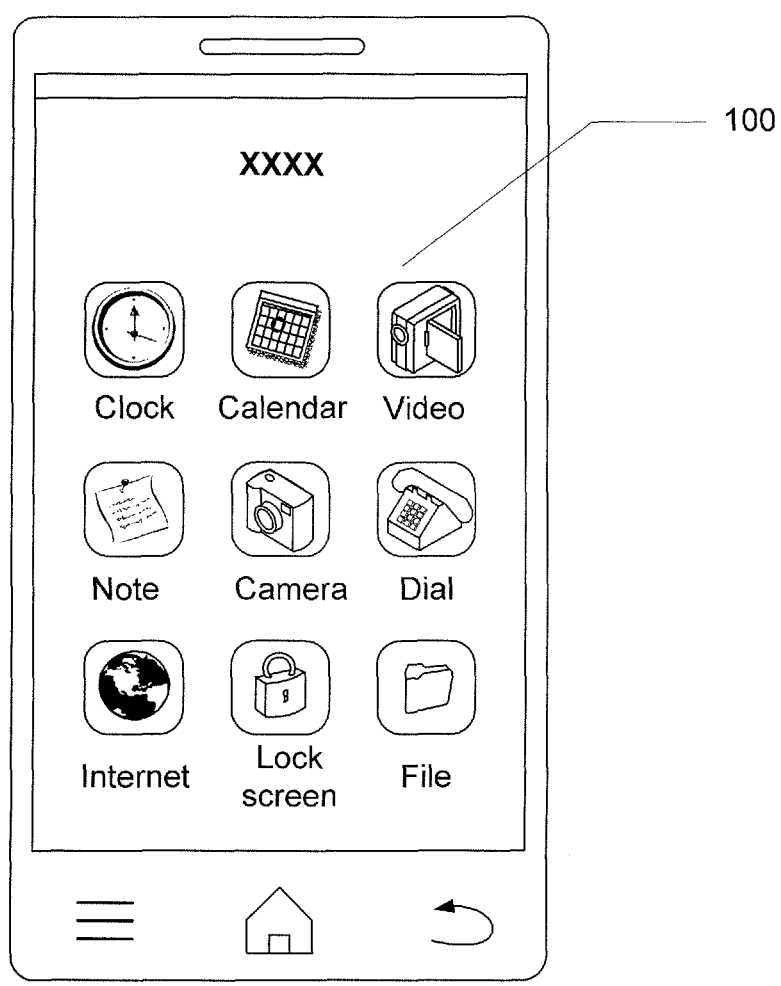
FIG. 9 is a schematic diagram of a mobile phone with a display device according to a second exemplary embodiment of the present disclosure.

FIG. 9 illustrates a schematic diagram of a mobile phone installed with any one of the display devices according to the first exemplary embodiment. The display electronic device 100 may be any one of the display devices in the first exemplary embodiment. After the mobile phone is installed with the display screen 100, the photovoltaic material in the display device can form a current loop which is connected with a power source of the mobile phone or an electrical apparatus. When the display device 100 of the mobile phone emits light, the photovoltaic material absorbs the light and converts it to electrical energy for use by the mobile phone.

The device provided by the present exemplary embodiment can operate by using the electrical energy obtained by converting light by the above described display device, and the standby time of the device may be increased and the user experience may be improved without influencing the display effect experienced by the user.

Third Exemplary Embodiment

Figure 10:
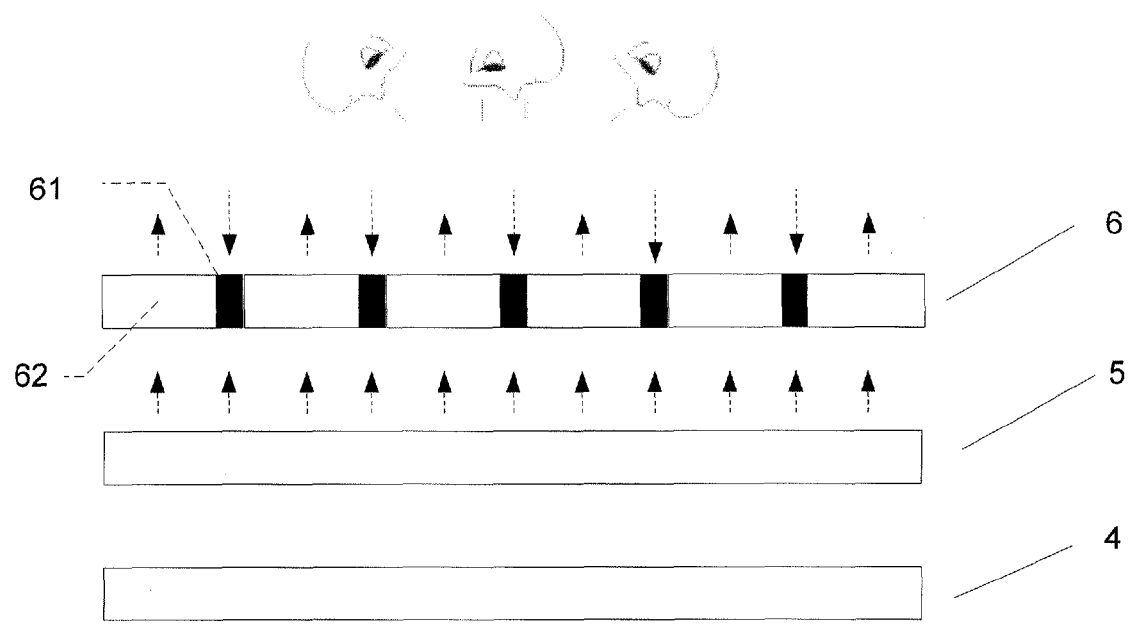
FIG. 10 is a cross-section diagram of a display device according to a third exemplary embodiment of the present disclosure.

FIG. 10 is a cross-section diagram of a display device according to the third exemplary embodiment of the present disclosure. The exemplary embodiment provides a display device, which includes a supporting layer 4, a backlight layer 5 and a display layer 6.

The display layer 6 is located above the backlight layer 5 and has an array formed by a photovoltaic material 61, the array uniformly forms multiple light transmitting units 62 on a horizontal plane of the display layer 6, and the photovoltaic material 61 of the array forms a path for absorbing light emitted from the backlight layer 5 or the ambient light and convert it into current.

The backlight layer 5 provides a light source for the display layer 6, and the supporting layer 4 is located under the backlight layer 5 and provides a support for the display layer 6 and the backlight layer 5.

In present exemplary embodiment, the above described display device is a display screen.

In related art, to enable the display screen to display different colors, the display screen displays colors based on a RGB model. And the display screen takes each pixel as a display unit. To achieve different collocation of RGB colors, a driving circuit needs to be disposed around each pixel, for example, a TFT array may be disposed in a display layer of a TFT screen.

In the present exemplary embodiment, the supporting layer 4 may be a reflector (i.e., a reflective material), which can reflect back the light emitted downward from the backlight layer 5 to increase the brightness of the display screen.

Figure 11:
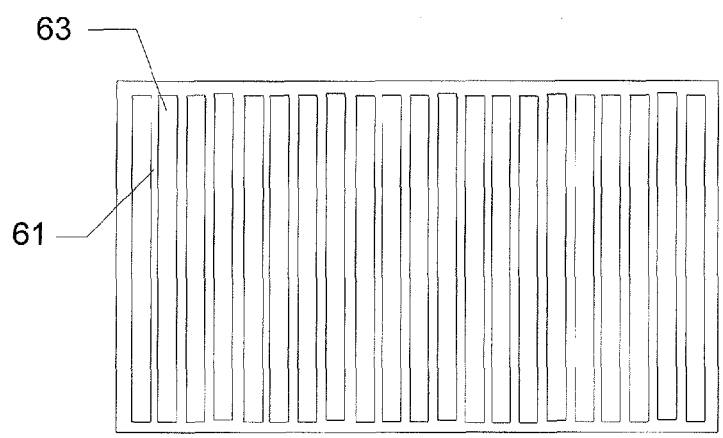
FIG. 11 is a plan view of light transmission units and an arrangement of the light transmission units in the display layer of the display device according to the third exemplary embodiment of the present disclosure.
Figure 12:
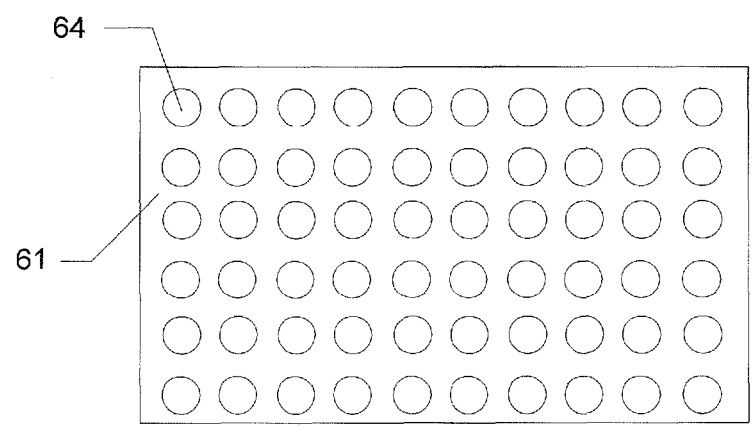
FIG. 12 is a plan view of another light transmission units and an arrangement of the light transmission units in the display layer according to the third exemplary embodiment of the present disclosure.

It should be noted that, in the present exemplary embodiment, as illustrated in FIG. 11 or FIG. 12, the light transmitting units 62 are linear apertures 63 or circular apertures 64. However, the light transmitting units 62 are not limited to the linear aperture or the circular aperture, and may also be other shapes such as a rectangle, a polygon, or a combination of various shapes.

In an exemplary embodiment, the photovoltaic material used in the third exemplary embodiment may be any material with photon-to-electron conversion function. For example, the photovoltaic material may be, but is not limited to, any one or a combination of the following materials: amorphous silicon, microcrystalline silicon, a cadmium telluride thin film solar cell, and a thin film solar cell.

In order to avoid affecting the light emission of the display device by the photovoltaic material 61, the third exemplary embodiment may be of the following two implementations, for example.

In the first implementation, the photovoltaic material 61 is embedded in a preset position in the display layer, the preset position being directly above or directly under a part or all of the driving circuits in the display device, or the photovoltaic material is provided at both a position directly above a part or all of the driving circuits in the display device and a position directly under a part or all of the driving circuits in the display device.

It should be noted that, in order to enable the display screen to control displaying images, a driving circuit 65 (for example, a TFT array) is included in the display layer 6, and is configured to control the display color of the pixel.

Figure 13:
FIG. 13 is a schematic layout diagram of a photovoltaic material in the display layer of the display device according to the third exemplary embodiment of the present disclosure.
Figure 13:
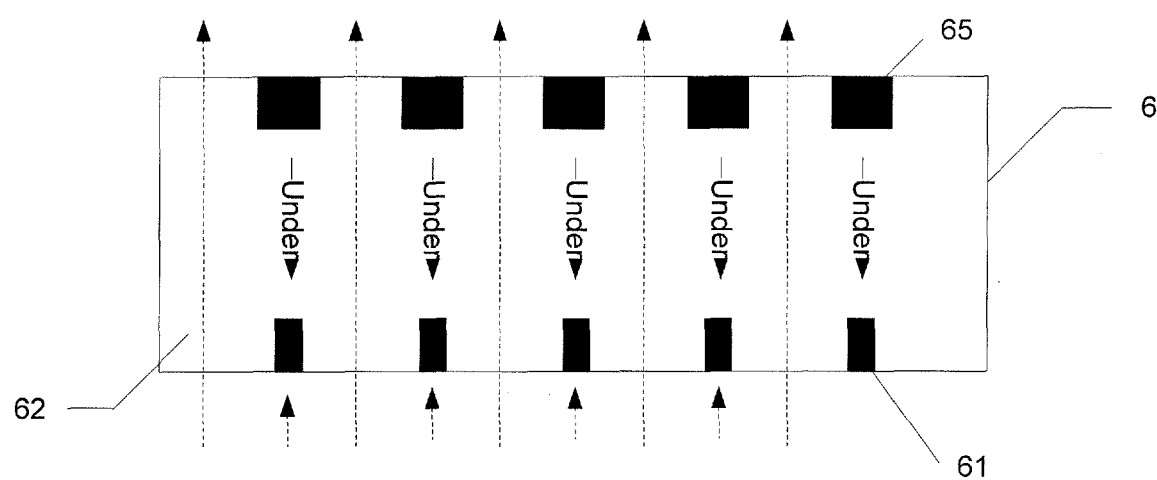

FIG. 13 is a schematic layout diagram of a photovoltaic material in the display layer of the display device according to the third exemplary embodiment. The photovoltaic material 61 is located under the driving circuits 65 in the display layer 6. To avoid blocking the light emitted from the display screen by the photovoltaic material 61, the horizontal area of the photovoltaic material 61 is less than the horizontal area of the driving circuit 65, at the same time, the object that the photovoltaic material 61 absorbs the light emitted from the backlight layer 5 to convert it into the electrical energy may be achieved. The parts denoted by the dashed line in FIG. 13 represent the state of the divergence of light. As shown in FIG. 13, the light may be normally dispersed out through the light transmitting units 62 without affecting the brightness of the screen.

Figure 14:
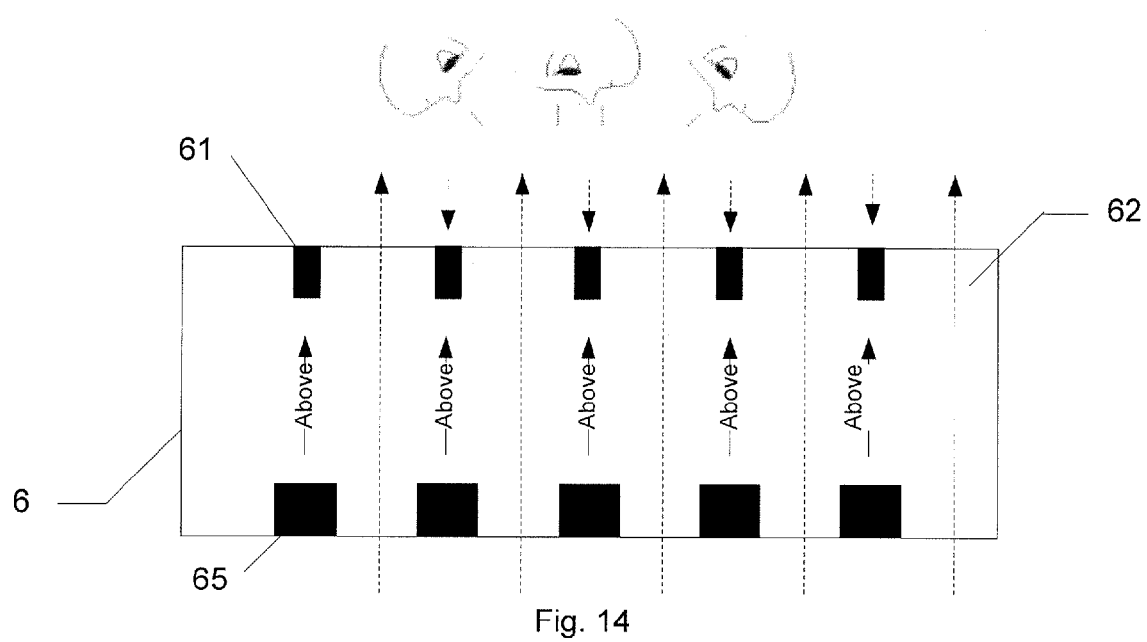
FIG. 14 is another schematic layout diagram of a photovoltaic material in the display layer of the display device according to the third exemplary embodiment of the present disclosure.

As illustrated in FIG. 14, the photovoltaic material 61 is directly above the driving circuits 65 in the display layer 6. In order to avoid blocking the light emitted from the display screen by the photovoltaic material 61, the horizontal area of the photovoltaic material 61 is less than the horizontal area of the driving circuit 65, at the same time, the object that the photovoltaic material 61 absorbs the light emitted from the backlight layer 5 and converts it into the electrical energy may be achieved. The parts denoted by the dashed line in the present exemplary embodiment represent the state of the divergence of light. The light may be normally dispersed out through the light transmitting units 62 without affecting the brightness of the screen.

Figure 15:
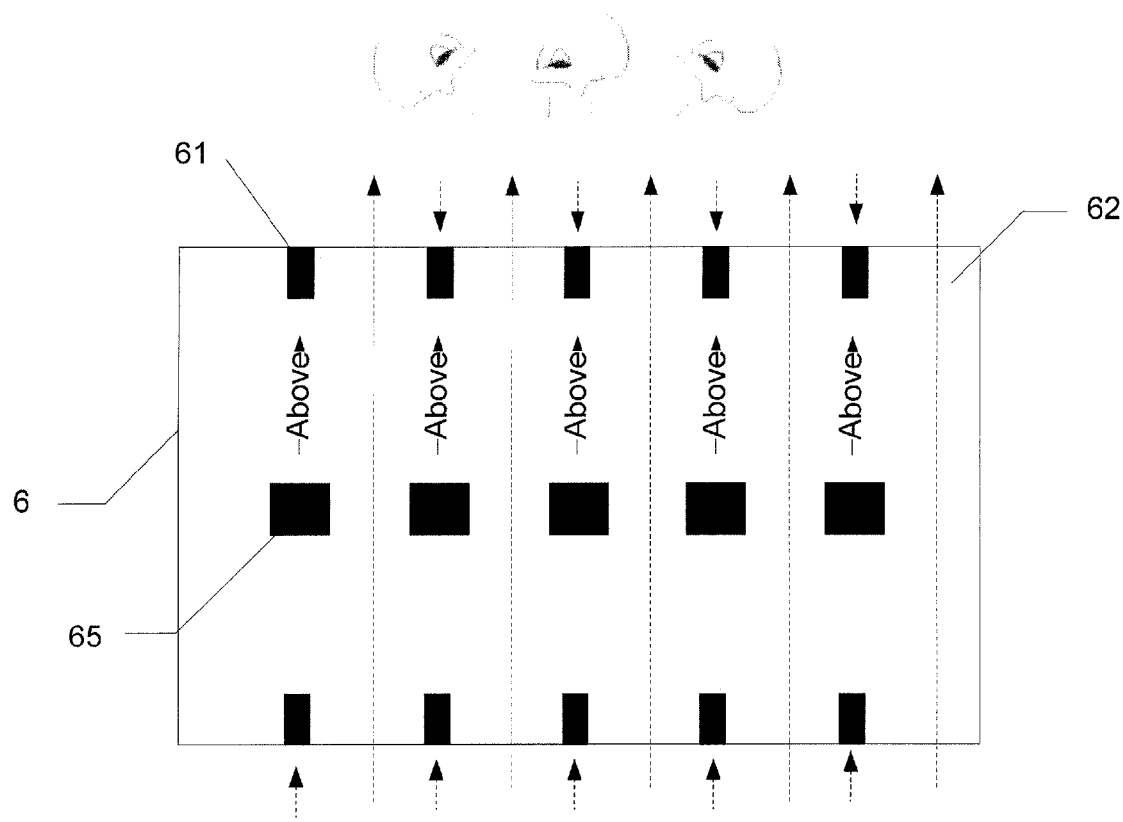
FIG. 15 is another schematic layout diagram of a photovoltaic material in the display layer of the display device according to the third exemplary embodiment of the present disclosure.

As illustrated in FIG. 15, the photovoltaic material 61 is provided directly above and directly under the driving circuit 65 in the display layer 6. In order to avoid blocking the light emitted from the display screen by the photovoltaic material 61, the horizontal area of the photovoltaic material 61 is less than the horizontal area of the driving circuit 65. The parts denoted by the dashed line in FIG. 15 represent the state of the divergence of light. As shown in FIG. 15, the light may be normally dispersed out through the light transmitting units 62 without affecting the brightness of the screen. The photovoltaic material 61 directly under the driving circuit 65 may absorb the light emitted from the backlight layer 5, and the photovoltaic material 61 directly above the driving circuit 65 may absorb the ambient light, then the absorbed light is converted into electronic energy.

In an exemplary embodiment, the manner of embedding the photovoltaic material 61 in the display layer 6 may be as follows: a groove is formed at a preset position of the reflector by photolithography, and then the photovoltaic material 61 is provided in the groove. The depth of the groove may be predetermined and related to the photon-to-electron conversion efficiency of the photovoltaic material 61.

In the third exemplary embodiment, when disposing the photovoltaic material in the display layer 6, a connection between the photovoltaic materials 61 may be assured so that a current may be formed in and flow through the photovoltaic materials 61.

Figure 16:
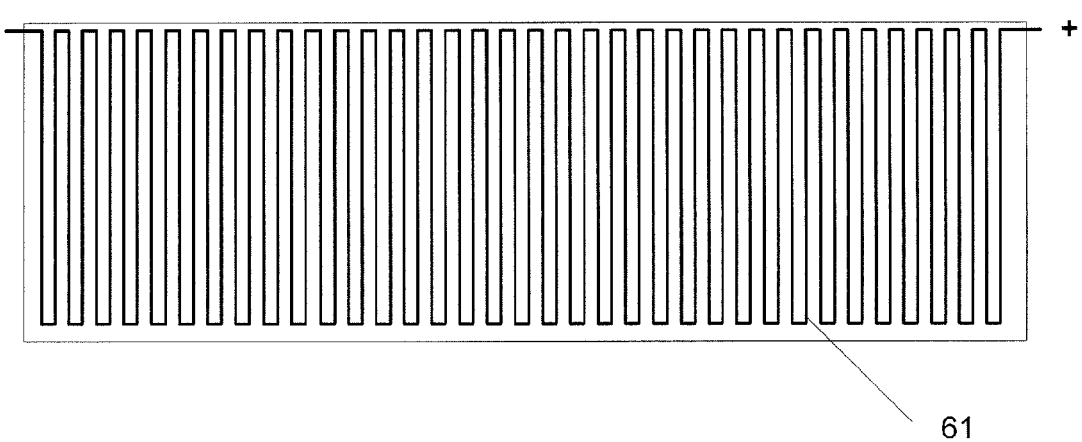
FIG. 16 is a plan view of a connecting way of the photovoltaic material in the display layer according to the third exemplary embodiment of the present disclosure.

FIG. 16 shows a plan view of a display layer 6, in which one connection manner of the photovoltaic materials is provided.

The photovoltaic materials are arranged in the display layer 6 in a form of linear array, and are connected head to tail to form a path which includes two poles of "+" and "−", so that the current obtained by the conversion may be transmitted to an electric energy storage device or an electric energy consumption device.

Figure 17:
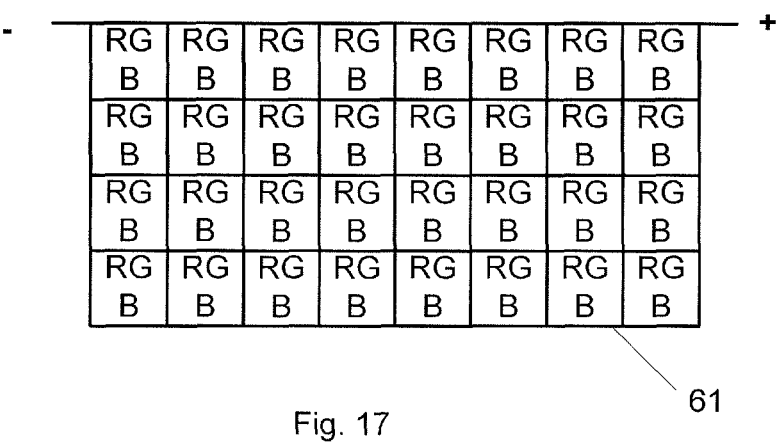
FIG. 17 is a plan view of another connecting way of the photovoltaic material in the display layer according to the third exemplary embodiment of the present disclosure.

FIG. 17 shows a plan view of a display layer 6, in which another connection manner of the photovoltaic materials is provided.

The photovoltaic materials are arranged in the display layer 6 in a form of multiple rectangle boxes to form an array, and are connected head to tail to form a path which includes two poles of "+" and "−", so that the current obtained by the conversion may be transmitted to an electric energy storage device or an electric energy consumption device. In order to avoid blocking the light emitted from the display screen by the photovoltaic material, the embedding positions of the photovoltaic materials 61 are corresponding to the driving circuits, that is, the photovoltaic materials 61 are provided around each RGB pixel.

To testify the actionability of the schemes of the present exemplary embodiment, a display layer structure used in an organic light-emitting diode (OLED) display screen is provided by the present exemplary embodiment.

Figure 18:
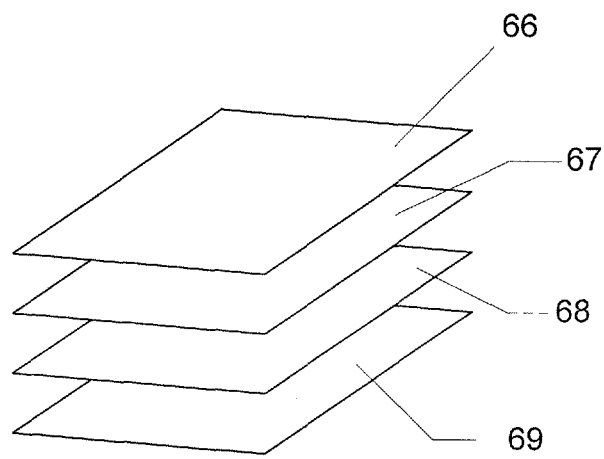
FIG. 18 is a cross-section diagram of a structure of a display layer according to the third exemplary embodiment of the present disclosure.

FIG. 18 shows a structure of the OLED display layer, wherein, the display layer 6 includes an upper polarizer 66, a color glass filter 67, a thin film field effect glass sheet 68 and a lower polarizer 69 in an order from top to bottom.

The photovoltaic materials are embedded in the upper polarizer 66, and the embedding position of the photovoltaic materials is directly above a preset part of the driving circuits or directly above all the driving circuits in the display layer 6. The light transmitting units are formed in regions in the upper polarizer except the embedding position.

In the implementation, micro lenses are provided under the light transmitting units 62, the micro lens being configured to focus the light blocked by the photovoltaic materials and then refracting it to an upper side of the display layer.

After embedding the photovoltaic material in the display layer 6, the light emitted from the screen may be weakened due to the light-absorbing of the photovoltaic material, and the visual effect experienced by the user may be influenced. In an exemplary embodiment, the light under the photovoltaic materials and emitted from the backlight layer 5 is focused by the micro lenses and then is refracted onto the photovoltaic material.

Figure 19:
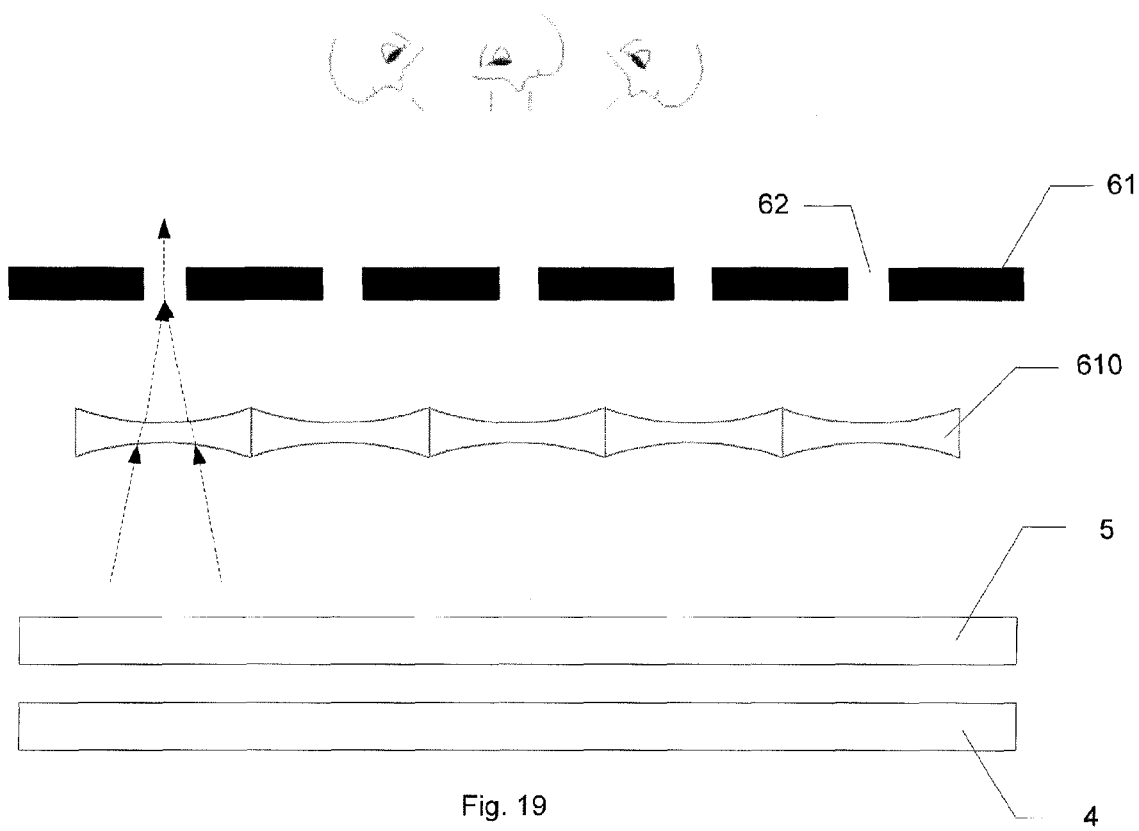
FIG. 19 is a cross-section diagram of a structure of a display device with micro lenses according to the third exemplary embodiment of the present disclosure.

For illustration purposes, the present exemplary embodiment provides an approach for light transmitting units that have linear apertures, such as the light transmitting units shown in FIG. 11. FIG. 19 is a cross-section diagram of a display layer with additional micro lenses.

As shown in FIG. 19, the display device includes a supporting layer 4, a backlight layer 5 and a display layer, the display layer includes the photovoltaic materials 61, the light transmitting units 62 and the micro lenses 610, and the micro lens 610 may be a biconcave lens. The horizontal area of the photovoltaic material increases, and the light transmitting units 62 are insufficient to provide a high transmittance for the user. Thus, micro lenses 610 are added under the light transmitting units 62. The micro lenses 610 focus the light under the photovoltaic materials 61 and transmit it upwards to the user by a refraction effect, thus the transmittance of the display screen may be enhanced.

Figure 20:
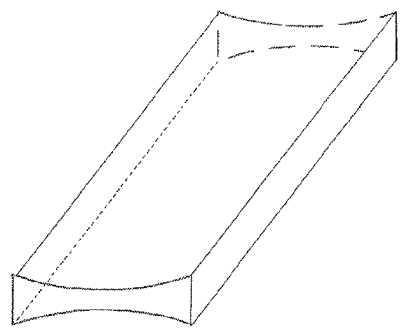
FIG. 20 is a schematic diagram of a micro lens according to the third exemplary embodiment of the present disclosure.

In view of the light transmitting units with linear apertures shown in FIG. 11, FIG. 20 illustrates a linear biconcave lens, which is configured to be positioned under the light transmitting units of linear aperture.

In the present exemplary embodiment, the micro lenses that are positioned under a light transmitting unit may be any one or combination of the following lenses: a plano-convex lens, a plano-concave lens, a biconvex lens, a biconcave lens, a symmetric spherical lens or an asymmetric spherical lens.

Figure 21:
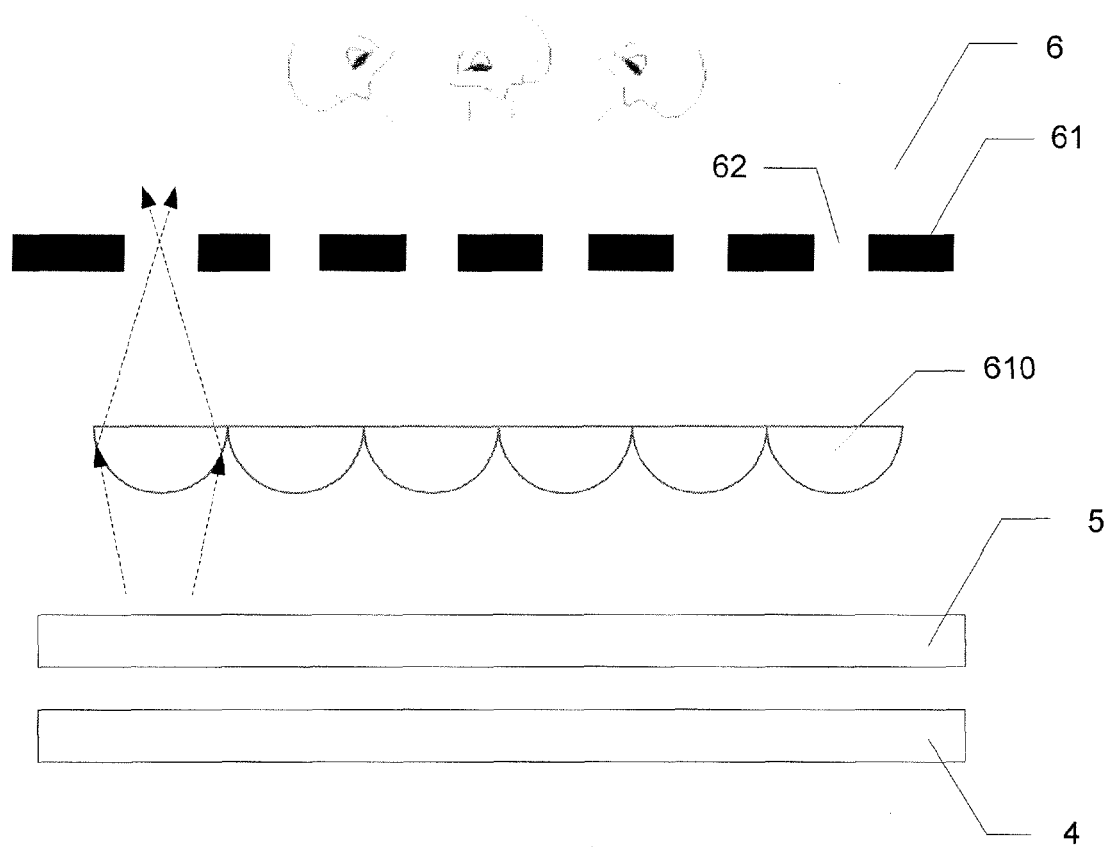
FIG. 21 is a cross-section diagram of a structure of another display device with a micro lens according to the third exemplary embodiment of the present disclosure.

As illustrated in FIG. 21, the present exemplary embodiment further provides a display device added with another type of micro lenses, wherein, the display device includes a supporting layer 4, a backlight layer 5 and a display layer 6, the display layer 6 includes the photovoltaic materials 61, the light transmitting units 62 and the micro lenses 610, the micro lens 610 may be a plano-convex lens. As the horizontal area of the photovoltaic material is increased, and the light transmitting units 62 may be insufficient to provide a high transmittance for the user. Thus, the micro lenses 610 may be added under the light transmitting units 62. The micro lenses 610 focus the light under the photovoltaic materials 61 and transmit it upwards to the user by a refraction effect, thus the transmittance of the display screen may be enhanced.

Figure 22:
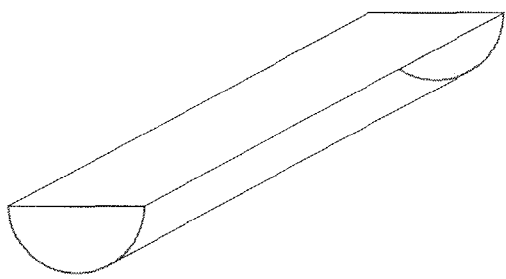
FIG. 22 is a schematic diagram of another micro lens according to the third exemplary embodiment of the present disclosure

In view of the light transmitting units that have the linear apertures shown in FIG. 11, FIG. 22 illustrates a linear plano-concave lens, which is configured to be positioned under the light transmitting unit.

In an exemplary embodiment, the refractive index of the micro lens has a preset refractive index which is determined by the user or design requirements.

In an exemplary embodiment, the supporting layer is a reflector which is configured to reflect the light emitted downward from the backlight layer 5.

Figure 23:
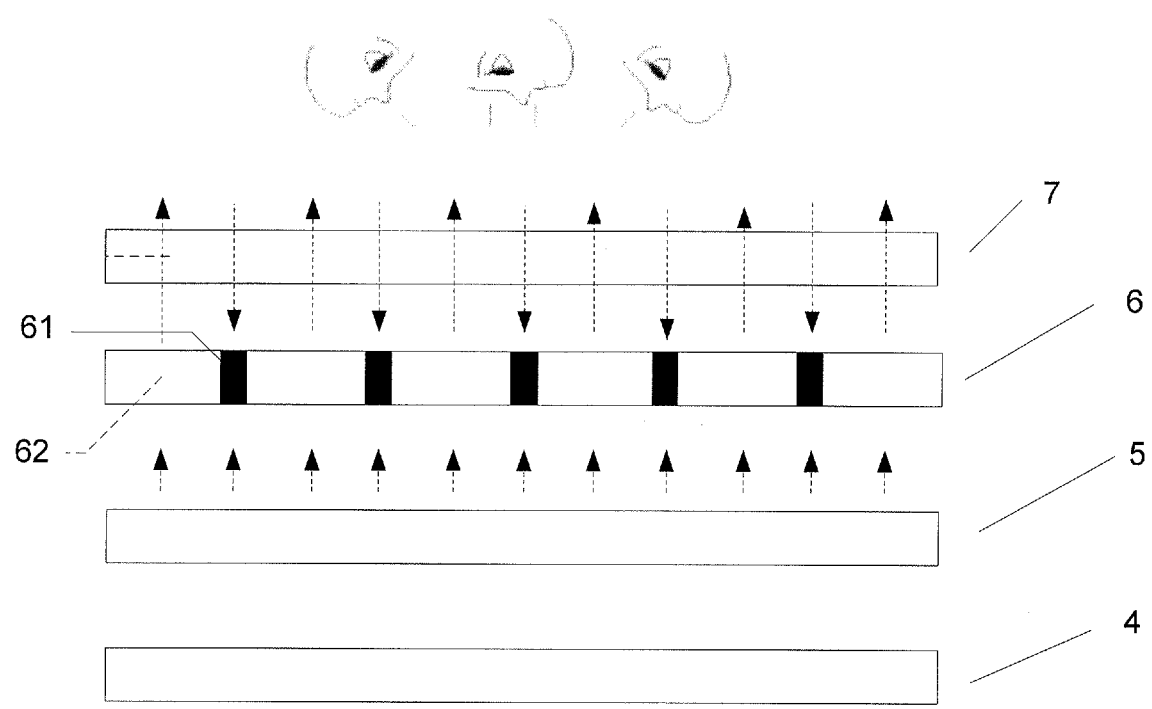
FIG. 23 is a cross-section diagram of a structure of another display device according to the third exemplary embodiment of the present disclosure.

FIG. 23 is a cross-section diagram of a structure of another display device according to the third exemplary embodiment. In addition to a supporting layer 4, a backlight layer 5 and a display layer 6, the display device may also include a touching layer 7.

The touching layer 7 is located above the display layer 6 and is configured to detect and respond to a tap signal thereon. For example, the touching layer is configured to detect a touch from user and respond to the touch.

In an exemplary embodiment, the light transmitting unit 62 is transparent to light with a preset spectrum, such as visible light at a preset frequencies range, so that the visible light may be transmitted through the display device without affecting the transmittance.

When the display device is a touch screen, it may additionally include a touching layer 7 above the display layer 6. The touching layer 7 is configured to respond to a tap signal from the user and transmits the signal to a processor for processing. The touching layer 7 includes, but is not limited to, a resistive touch screen, a capacitive touch screen, etc.

The exemplary embodiments of the present disclosure provides a display device, which includes a display layer, a backlight layer and a supporting layer; wherein, the display layer is located above the backlight layer and includes an array formed by photovoltaic materials, the array uniformly forms multiple light transmitting units on the horizontal plane of the display layer, and the photovoltaic materials of the array are connected to form a path for absorbing the light emitted from the backlight layer or the ambient light and convert it into current; the backlight layer provides a light source for the display layer, the supporting layer is positioned under the backlight layer and provides a support for the display layer and the backlight layer. In the display device provided by the exemplary embodiments of the present disclosure, the photovoltaic materials are uniformly embedded in the display layer, the array including the photovoltaic materials forms light transmitting units, and the photovoltaic materials forms a path, thus the light emitted from the backlight layer or the ambient light may be absorbed and converted into current without affecting the light emitting of the display layer, and the current obtained by the light conversion is used in a mobile terminal, which can increase the standby time of the mobile terminal and improve the user experience.

Fourth Exemplary Embodiment

The present exemplary embodiment provides a device, which includes the display device according to the third exemplary embodiment, and the device receives and uses the current provided by the display device.

In the present exemplary embodiment, the device is a mobile terminal. After the display device provided by the third exemplary embodiment is installed as a display screen in the mobile terminal, while using a portable power source, the mobile terminal also may receive the current obtained by the photoelectric conversion in the display device for its operation or receive the current and store it in the portable power source for standby application. Thus, the light source emitted from the display screen itself may be reused and recycled, the maximum efficiency of electrical energy may be achieved, and the standby time of the mobile terminal may be increased, and the user experience may be improved.

In the present exemplary embodiment, the device is not limited to the mobile terminal such as a mobile phone, a tablet, a laptop, and it is applicable for any device with a display screen, such as a TV, a desktop computer.

Figure 24:
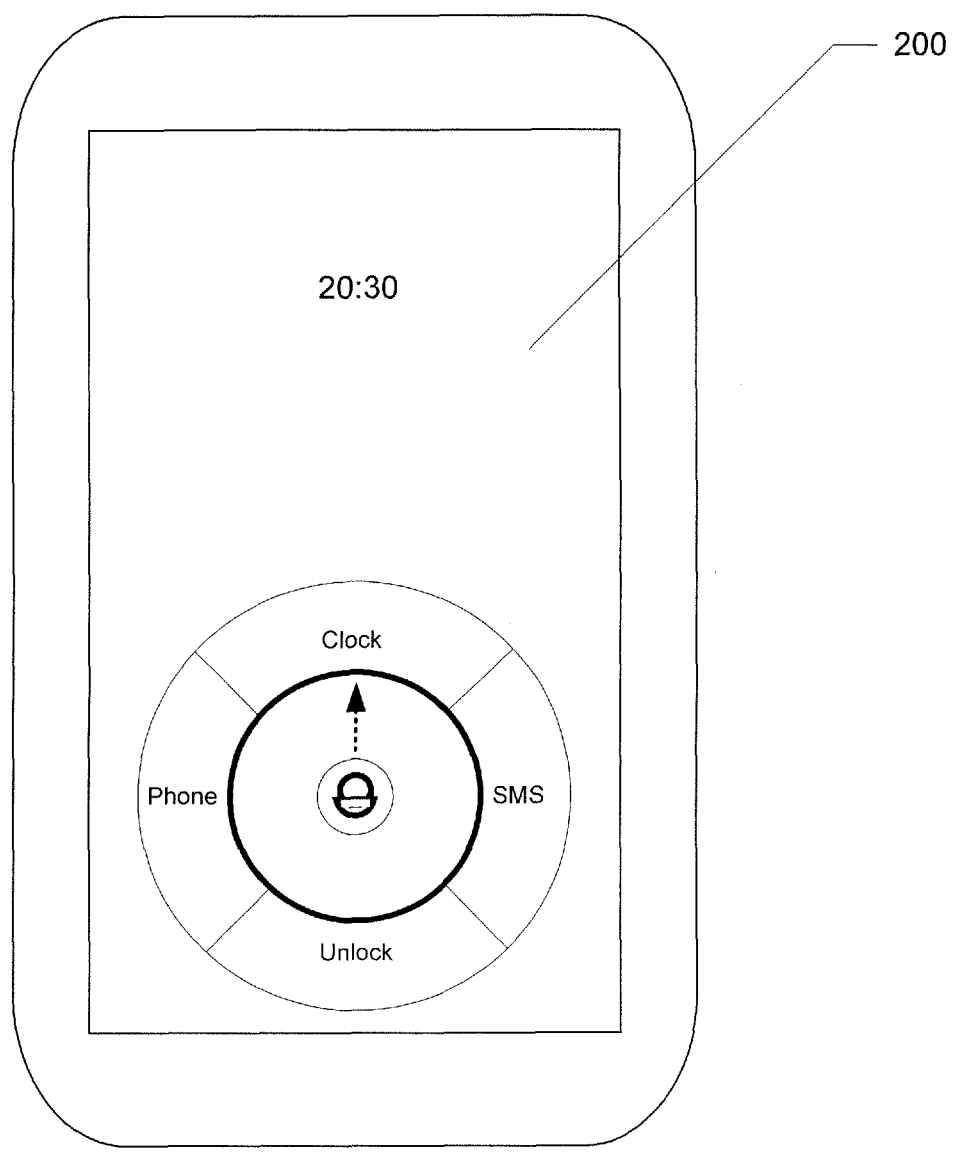
FIG. 24 is a schematic diagram of a mobile phone with a display device according to the fourth exemplary embodiment of the present disclosure.

FIG. 24 illustrates a schematic diagram of a mobile phone installed with any one of the display devices according to the third exemplary embodiment. The display device 200 is any one of the display devices according to the third exemplary embodiment. After the mobile phone is installed with the display screen 200, the photovoltaic material in the display device can form a current generating circuit which is connected with a power source of the mobile phone or an electrical apparatus. When the display device 200 of the mobile phone emits light, the photovoltaic material absorbs the light and converts it to the electrical energy for use by the mobile phone.

The device provided by the present exemplary embodiment can operate by using the electrical energy obtained by converting light by the above described display device, and the standby time of the device may be increased and the user experience may be improved without influencing the display effect experienced by the user.

Through the above description to the exemplary embodiments, it may be clearly understood by those skilled in the art that, the exemplary embodiments of the present disclosure may be implemented by hardware, or by software with necessary common hardware platform. Based on such understanding, the technical solutions of the exemplary embodiments of the present disclosure may be embodied in a form of software product which may be stored in a non-volatile storage medium (such as a CD-ROM, a flash disk, or a mobile hard disk) and which may include a series of instructions to enable a computer device (such as a personal computer, a server, or a network device) to implement the method described in the exemplary embodiments of the present disclosure.

It could be understood by those skilled in the art that, the accompanying drawings are only illustrative diagrams for the preferred exemplary embodiments, and the modules or the procedures in these drawings may not be necessary for implementing the present disclosure.

It could be understood by those skilled in the art that, the modules in a device of the exemplary embodiment may be distributed in the device according to the description of the exemplary embodiments, or may be correspondingly varied to be contained in one or more device other than that of this exemplary embodiment. The modules in the above exemplary embodiments may be combined as one module, or may be further divided into several sub-modules.

The aforementioned sequence numbers of the exemplary embodiments of the present disclosure are merely for description purpose, not representing the superiority or inferiority of the exemplary embodiments.

It is apparent that those skilled in the art may make various modifications and variation to the present disclosure without departing the spirit and scope of the present disclosure. Accordingly, if such modification and variation fall within the scope of the claims of the present application or equivalents thereof, the present application intends to embrace such modification and variation.

The invention claimed is:

1. A display device, comprising:
a light emitting and display layer configured to display an image by emitting light, including a first array of pixels and pixel driving circuits; and
a supporting layer under the light emitting and display layer, including a second array of photovoltaic material under the array of pixel driving circuits to absorb light emitted from the light emitting and display layer and convert the light into an electronic current.

2. The display device according to claim 1, wherein the supporting layer further comprises a reflector, and
the photovoltaic material is embedded in the reflector.

3. The display device according to claim 1, wherein the photovoltaic material in the second array is no wider than a width of an individual driving circuit in the array of driving circuits.

4. The display device according to claim 1, wherein the photovoltaic material is composed by at least one of:
amorphous silicon, microcrystalline silicon, a cadmium telluride thin film solar cell, and a thin film solar cell.

5. The display device according to claim 1, wherein the light emitting and display layer comprises:
a display layer configured to
control a display color of each pixel in the first array through a driving circuit in the first array corresponds to the pixel in the first array, and
display the image under the backlight provided by a backlight layer; and
the backlight layer under the display layer, configured to provide backlight for the display layer.

6. The display device according to claim 1, wherein the light emitting and display layer comprises, from top to bottom, a cathode, a reflector, a conductive layer and an anode,
when applying a voltage between the cathode and the anode, electrons in the conductive layer move to the reflector, and holes are formed in the conductive layer, transit to the reflector, and recombine with the electrons and release energy to emit light.

7. The display device according to claim 1, further comprising a touching layer above the light emitting and display layer, configured to detect and respond to a tap signal exerted thereon.

8. The display device according to claim 1, wherein gaps in the second array are configured to provide a perfect reflection to light within a predetermined spectrum.

9. The display device according to claim 1, wherein the second array comprises a plurality of parallel lines of photovoltaic material, the parallel lines of photovoltaic material have a same length, are connected in series, and are arranged in a horizontal direction of the display device.

10. A display device, comprising:
a display layer configured to display an image, including:
a first array of photovoltaic material configured to absorb and convert light into an electronic current, and
a plurality of light transmitting units;
a backlight layer under the display layer and configured to provide light source for the display layer;
a supporting layer under the backlight layer to support the display layer and backlight layer.

11. The display device according to claim 10, wherein each of the plurality of light transmitting units is a linear aperture or a circular aperture.

12. The display device according to claim 11, wherein the display layer further comprises a plurality of micro lenses,
each micro lens is located under a corresponding light transmitting unit and is configured to focus and transmit light blocked by the photovoltaic material to an upper side of the display layer.

13. The display device according to claim 12, wherein from a top view a shape of each of the micro lens is a linear shape along the linear aperture.

14. The display device according to claim 12, wherein each of the plurality of micro lens is at least one of:
a plano-convex lens, a plano-concave lens, a biconvex lens, a biconcave lens, and a symmetric or asymmetric spherical lens.

15. The display device according to claim 12, wherein a refractive index of the plurality of micro lenses is a preset refractive index.

16. The display device according to claim 10, wherein the display layer comprises, from top to bottom, an upper polarizer, a color glass filter, a thin film field effect glass sheet, and a lower polarizer,
the photovoltaic material is embedded in the upper polarizer directly above an array of a plurality of pixel driving circuits in the display layer, and the plurality of light transmitting units are formed in regions of the upper polarizer excluding the photovoltaic material.

17. The display device according to claim 10, wherein the supporting layer is a reflector configured to reflect light emitted downward from the backlight layer.

18. The display device according to claim 10, further comprising a touching layer above the display layer and configured to detect a tap signal exerted thereon.

19. The display device according to claim 10, wherein the plurality of light transmitting units are transparent to light within a preset spectrum.

20. The display device according to claim 10, wherein the first array comprises a plurality of parallel lines of the photovoltaic material, the parallel lines of photovoltaic material have a same length, are connected in series, and are arranged in a horizontal direction of the display device.

* * * * *